US006844829B2

(12) United States Patent
Mayor

(10) Patent No.: US 6,844,829 B2
(45) **Date of Patent: *Jan. 18, 2005**

(54) ALARM SYSTEM AND KIT WITH EVENT RECORDING

(75) Inventor: Dwight Mayor, Calgary (CA)

(73) Assignee: Maxxal International, Inc., Calgary (CA)

(*) Notice: Subject to any disclaimer, the term of this patent is extended or adjusted under 35 U.S.C. 154(b) by 0 days.

This patent is subject to a terminal disclaimer.

(21) Appl. No.: 10/703,528

(22) Filed: Nov. 10, 2003

(65) Prior Publication Data

US 2004/0104812 A1 Jun. 3, 2004

Related U.S. Application Data

(63) Continuation of application No. 09/985,455, filed on Nov. 2, 2001, now Pat. No. 6,737,962, which is a continuation-in-part of application No. 09/558,154, filed on Apr. 26, 2000, now abandoned.

(51) Int. Cl.[7] ................................................ H03K 17/94
(52) U.S. Cl. ........................................... 341/27; 340/431
(58) Field of Search ............................ 341/27; 340/431, 340/438, 63, 429, 426

(56) References Cited

U.S. PATENT DOCUMENTS 4,665,379 A 5/1987 Howell et al.
4,897,642 A 1/1990 DiLullo et al. ........ 340/825.06
4,952,908 A 8/1990 Sanner ...................... 340/429
4,970,496 A 11/1990 Kirkpatrick ................ 340/585
5,119,504 A 6/1992 Durboraw, III
5,463,371 A 10/1995 Fuller
5,513,244 A 4/1996 Joao et al.
5,557,254 A 9/1996 Johnson et al.
5,587,701 A 12/1996 Hess
5,654,691 A 8/1997 Wang
5,666,647 A 9/1997 Maine
5,704,151 A 1/1998 West et al.
5,739,748 A 4/1998 Flick
5,777,551 A 7/1998 Hess
5,793,283 A 8/1998 Davis
5,793,284 A 8/1998 Teague
5,850,180 A 12/1998 Hess
5,874,889 A 2/1999 Higdon et al.
5,884,221 A 3/1999 Wortham
5,914,675 A 6/1999 Tognazzini
5,917,411 A 6/1999 Baggarly
5,917,433 A 6/1999 Keillor et al.
5,920,128 A 7/1999 Hines
5,963,130 A 10/1999 Schalger et al.
5,964,877 A 10/1999 Victor et al.
5,969,433 A 10/1999 Maggiora et al. .......... 307/10.5
5,973,592 A 10/1999 Flick
5,986,543 A 11/1999 Johnson
6,011,465 A 1/2000 Wang
2002/0027502 A1 * 3/2002 Mayor ........................ 340/431

* cited by examiner

*Primary Examiner*—Brian Young
*Assistant Examiner*—Joseph Lauture
(74) *Attorney, Agent, or Firm*—Kenyon & Kenyon

(57) ABSTRACT

A stand alone alarm system and kit for vehicles are disclosed. The alarm system includes an alarm module connected to an audio and visual device and at least one sensor. The alarm system also includes an input device coupled to the alarm module. The alarm system also includes a housing that encloses the alarm module, battery, anti-tamper devices, a transmitter, a receiver, an unauthorized connect sensor, a reefer fault sensor, and a keypad. Upon triggering the alarm module, a signal is transmitted to a remote device or a receiving device. The alarm system further includes a mechanism for automated, long-term tracking of events relating to operation of the vehicle.

17 Claims, 7 Drawing Sheets

ALARM SYSTEM AND KIT WITH EVENT RECORDING

This application is a continuation of application Ser. No. 09/985,455 filed 2 Nov. 2001 now U.S. Pat. No. 6,737,962, which is a continuation-in-part of application Ser. No. 09/558,154, filed April 26, 2000 now abandoned.

BACKGROUND OF THE INVENTION

1. Field of Invention

The present invention relates generally to alarm systems for vehicles, although features maybe useful for other applications. In particular, the present invention relates to an alarm system packaged in a form that permits the system to be adapted to various trailer and tractor-trailer configurations without loss of performance. The invention further relates to an alarm system with an event tracking and reporting capability, for tracking and reporting security and operational aspects of trailer transportation or other delivery applications.

2. Description of Related Art

Security, particularly in the transportation of goods, is a growing concern in today's society. Many automobiles, trucks, sports utility vehicles, and vans include security systems designed to alert users when their vehicles are being entered or malfunction. Most of these security systems are hard wired, or embedded, into the vehicle, and communicate with the user with dashboard prompts or audible alarms. These systems, operating as a security system are generally turned on/off through the use of a small wireless transmitter capable of being attached to the user's key chain. When turned on, the alarm is activated if the vehicle is tampered with or detects vibration. In some instances the alarm may be triggered when a person enters a proximity field established around the vehicle. The triggering of the alarm will cause the vehicle horn or a siren to sound. Options are also provided to flash the headlights of the vehicle. Vehicle malfunction alarms generally alert the operator of the vehicle through the use of dashboard prompts and/or audible signals. These systems typically are customized for installation at the factory or require the expertise of specialists in the after market sales and service. Existing commercial vehicles, notably tractor-trailer units, are inadequately protected, or the cost of a customized system is an impediment to security.

Large trucks, such as tractor-trailer combinations and specifically the trailer, have an increased monitoring area and number of checkpoints. Embedding such a system and customizing for each type of truck, and the ancillary equipment attached, would require a specific configuration for each trailer or other system. Different systems for each tractor-trailer configuration would be costly. Additional problems arise with the changing of drivers and persons in control and requiring access to the trailer. Additional problems arise as a result of trailers not having the power available to operate a system when detached from a tractor.

It is further observed that delivery systems in general utilize a wide variety of configurations of containers and means for moving the containers. In a tractor-trailer configuration, the container (i.e., the trailer) is separable from the means for moving the container (i.e., the tractor). In other configurations, the container and the means for moving the container are not separable, but are instead incorporated into the same vehicle. This is the case, for example, with delivery vans such as are used in courier-type applications (e.g., Fedex® vans). Such vehicles may be referred to as "body jobs" in the trucking/delivery industry.

Known security systems for delivery systems in general lack a capability for automated, long-term tracking of events such as security-related events, efficiency-related events or time-critical events. To be able to automatically record and analyze a long-term history of such events could be useful in decision-making for trucking/delivery companies.

An example of a security-related event is an attempt to break into a trailer of a tractor-trailer configuration, or to break into a body job such as a delivery van. Examples of efficiency-related events include events indicating an unnecessary consumption of fuel by a delivery van, or, for example in the case of a trailer with a refrigeration unit, events indicating how often and for how long the refrigeration unit was running.

Automated tracking of time-critical events would also be of help to trucking companies. Time-critical events can figure prominently in questions about contract performance or insurance liability. An example of a time-critical event that could have contractual or insurance implications is the unloading of a shipment by a receiver.

Known security systems for delivery systems do not provide for the automated, long-term tracking of events involved in the operation of delivery systems, such as security related events, efficiency-related events or time-critical events as described above. Rather, typically such tracking, if it is performed at all, is performed by human operators and is thus subject to either error or deliberate falsification.

Accordingly, a system is needed which addresses the above-noted concerns.

SUMMARY OF THE INVENTION

The present invention discloses a stand alone alarm system that can be adapted to and operate with various configurations to provide the desired security. The alarm system is easily accessible, stand alone, and able to with stand harsh environment conditions. In one embodiment of the invention, the components of the alarm system include an alarm module, an audio device, a visual device, and at least one sensor. The alarm system also includes a battery supplying power to the alarm system independently or in conjunction with other sources of power, and a keypad. The alarm system also includes a protective steel housing containing the alarm module, keypad, battery, anti tamper devices, and optional sensors from tampering and the environment. The optional sensors may include "reefer" (refrigeration unit) fault sensors and an unauthorized tractor trailer connection sensor. The alarm system also may include an optional pager transmitter, an automatic vehicle location interface, and a panic button receiver.

An advantage of the invention is that an alarm system is disclosed that reduces the disadvantages that have plagued known security systems. The alarm system is able to connect numerous sensors through either series or parallel inputs as well as providing the user with an audible alert, a visual alert, and optional pager and/or automatic vehicle locator of a problem, or violation of the trailer's integrity. Another advantage of the invention is that the system is a stand alone system permitting installation on a variety of vehicles, for example tractor trailers, recreational trailers, motor homes, storage trailers, and the like.

The alarm system further comprises means for automated, long-term tracking and reporting of security-related events, efficiency-related events and time-critical events, providing for informed and therefore improved decision-making by users of the system.

DETAILED DESCRIPTION OF THE PREFERRED EMBODIMENT

Figure 1:
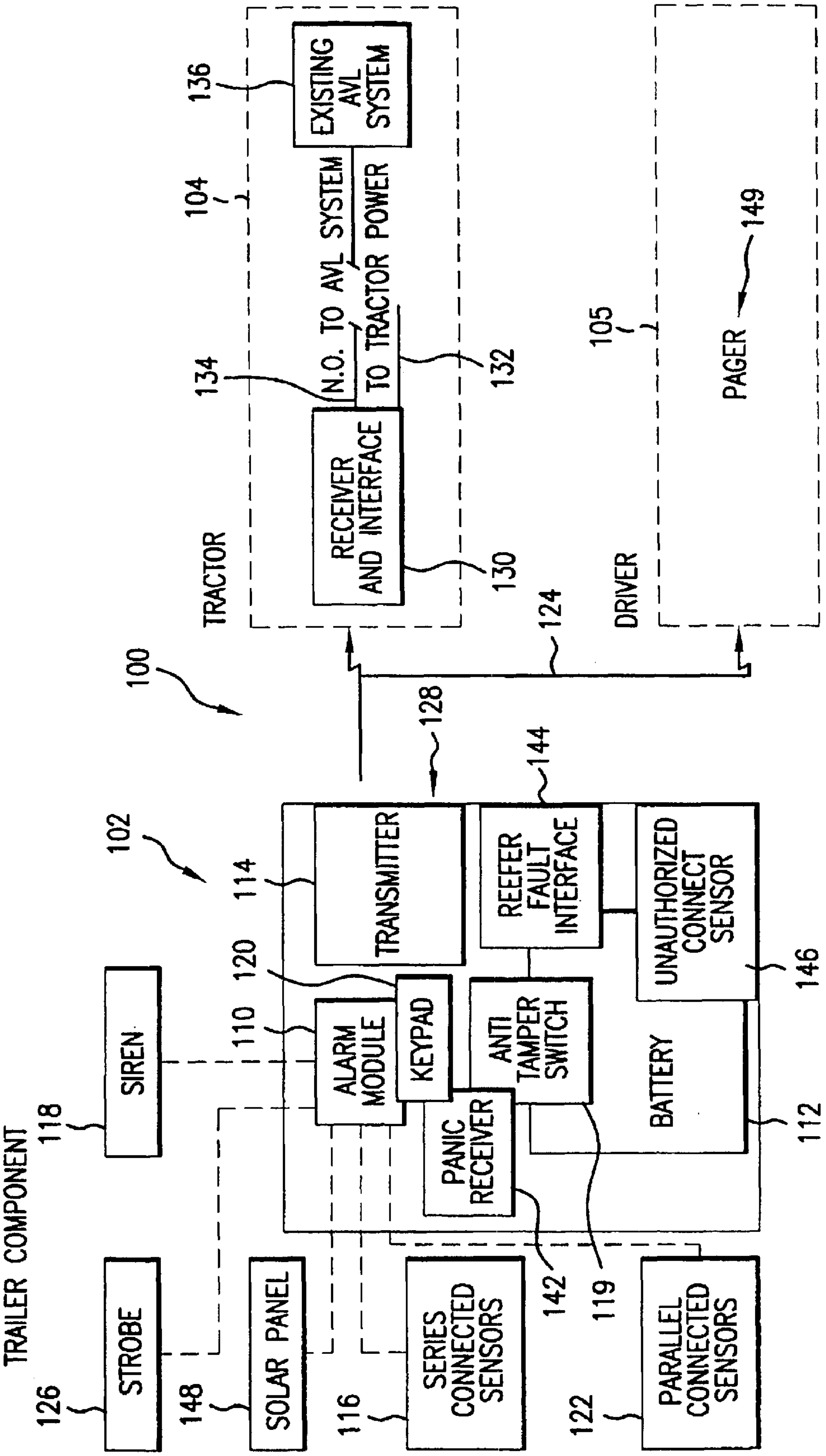
FIG. 1 shows an alarm system for a vehicle.

FIG. 1 depicts a security alarm system 100 for a vehicle in accordance with one embodiment of the present invention. Alarm system 100 includes two components, trailer alarm 102 and tractor receiver 104. Although disclosed as an embodiment having a tractor trailer configuration, alarm system 100 maybe used in conjunction with any vehicle configuration having the components in two different locations. Alternatively, the two components may be located together.

Alarm 102 includes alarm module 110 connected to a siren 118, a strobe light 126, and sensors 116 and/or 122. Alarm 102 also includes a keypad 120 coupled to alarm module 110. A battery 112 supplies primary power to alarm 102 if the alarm is operating in a stand alone application. If alarm 102 is powered by another power source, battery 112 functions as a back up battery. Anti-tamper switch 119 connects to alarm module 110. Transmitter 114, reefer fault interface 144, unauthorized tractor connect sensor 146, and panic receiver 142 also may be enclosed within housing 128 and coupled to alarm module 110.

Alarm module 110 is a processor that receives input from sensors 116 and/or sensors 122, anti tamper switch 119, and keypad 120. Alarm module 110 also may receive input from reefer fault interface 144, unauthorized tractor connect sensor 146, and panic receiver 142. Sensors 116 is an array of sensors connected to alarm module 110 in series. Sensors 122 is an array of sensors connected to alarm module 10 in parallel. Anti-tamper switch 119 is a sensor which detects an attempt to dismantle or disturb the contents of housing 128. Alarm module 110 detects a trigger event via sensors 116, 119, 122, or 146 and activates alarm module 10. Alarm module 110 remains activated for a preset time to conform with noise bylaws and ordinances. If after the preset time out sensors 116, 119, 122, or 146 continue to trigger alarm module 110, alarm module 110 remains active until such time the correct keypad 120 code is entered, the cause of the trigger is eliminated, or the power source is depleted.

Panic receiver 142 is responsive to a panic signal which may be generated at will by a user of alarm system 100, in order to trigger alarm module 110 at the user's discretion. The panic signal may, for example, be sent to panic receiver 142 by a small wireless transmitter as mentioned in the introductory portion above. Such a small wireless transmitter is typically known, and is referred to herein, as a "fob." If alarm module 110 is triggered by panic receiver 142, alarm module 110 remains active until reset by the user. Alarm module 110 activates siren 118, strobe light 126, and transmitter 114 in response to the alarm trigger. Siren 118 and strobe light 126 provide audible and visual indication that alarm module 110 has been triggered.

Transmitter 114 outputs a signal 124 that indicates alarm module 110 has been activated. Preferably, transmitter 114 transmits signal 124 at a frequency of about 27 MHz and an output power of about 4 watts. More preferably, signal 124 is a RF signal. If alarm 102 is connected to an outside power source, transmitter 114 receives its power from that source. Alternatively, if alarm 102 is operating in a stand alone mode transmitter 114 receives its power from battery 112. Once alarm module 110 has been triggered, it may not be shut off until the alarm status has been transmitted by transmitter 114. Housing 128 encloses the various components of alarm 102. Preferably alarm module 110, battery 112, keypad 120, and anti tamper switch 119 are enclosed by housing 128. Housing 128 also may contain transmitter 114, reefer fault interface 144, panic receiver 142, and unauthorized connect sensor 146.

Preferably, housing 128 is constructed of about 0.060 metric conversion or about 0.1524 centimeters, power coated steel. More preferably, housing 128 contains an about 0.060 metric conversion, or about 0.1524 centimeters, steel hinged cover secured by two latches and lined with a rubber gasket to provide protection against the environment. This hinged steel door provides access to keypad 120. Preferably, alarm module 110, keypad 120, and unauthorized connect sensor 146 include printed circuit boards that are conformal coated to provide further environmental protection. Further, reefer fault interface 144 is embedded in an epoxy potting compound to provide environmental protection. Moreover, housing 128 allows connective wires or cables to pass through the back of housing 128 directly to the inside of the trailer. In addition, the opening in the back of housing 128 is sealed with a rubber gasket between housing 128 and the trailer body to provide protection against the environment. These connective wires or cables provide connection to sensors 116 and/or sensors 122, siren 118, and strobe light 126. By having battery 112 enclosed within housing 128, alarm module 110 and transmitter 114 are capable of stand alone operations. Thus, protective housing 128 acts as a control panel that can be placed on any trailer and attached to the appropriate peripherals. Peripherals may include sensors 116 and/or sensors 122, siren 118, strobe light 126, and solar panel 148.

Battery 112 is a stand alone, independent power source. Alarm module 110 receives its power from battery 112 when unable to draw power from other sources. Battery 112 may serve as a backup power supply if power is lost from the tractor to the alarm module 110. Battery 112 may be a rechargeable battery that is charged from the tractor alternator when the vehicle is operated with its lights on. Alternatively, if alarm system 100 is used with a reefer application, power may be drawn from the reefer battery. Any device that provides 12 volt direct current power, or an equivalent, to the trailer can provide power to alarm module 110. Once the power is disconnected, however, battery 112 supplies power to alarm module 110. Alternatively, if alarm 102 is utilized in a trailer employed in a stand alone storage application, battery 112 may be recharged by solar panel 148.

Transmitter 114 transmits signal 124 to tractor receiving component 104. Receiving component 104 includes receiver/interface 130, connections 132 and 134, and vehicle location system 136. Receiver/interface 130 is any system or device that receives signal 124 from transmitter 114 and performs additional operations. As depicted in FIG. 1, receiver/interface 130 is mounted on a docking system installed on the tractor. Alternatively, receiver/interface 130 may be a pager 149 or other remote device that alerts a driver 105 that alarm module 110 has been triggered. Further, receiver/interface 130 may alert a dispatcher or central monitoring center that alarm module 110 has been triggered. Connection 132 connects receiver/interface to the tractor power supply. The tractor power supply may be the truck battery.

Connection 134 connects receiver/interface 130 to location system 136. Location system 136 is an automatic vehicle location system that uses global positioning satellite system ("GPS") data to determine the location of receiving component 104 and corresponding alarm component 102. Alternatively, location system 136 may be any other system capable of providing position data to a remote location. Upon receiving indication that alarm module 110 has been triggered, location system 136 queries GPS satellites to determine the location of the truck. This information may be provided to a dispatch office or a central monitoring center.

Alternatively, if any other form of vehicle location system 136 is used to determine and report position, this information may be reported to a dispatcher or central monitoring center. Further, receiver/interface 130 may provide visual and audible cues to driver 105 that alarm 102 has been triggered.

Receiver/interface 130 also may provide visual and audible indication to the driver 105 that the receiver/interface 130 and automatic vehicle location system 136 are docked properly. Thus, when properly docked, alarm components 102 and receiver/interface 130 are coupled to receive signal 124 from transmitter 114. Preferably, location system 136 activates upon docking and subsequent alarm conditions. Alternatively, location system 136 may activate only upon alarm conditions triggered by alarm module 110 and transmitted by transmitter 114.

Although described in the context of a tractor trailer configuration, alarm system 100 is compatible with a travel trailer, motor home, or trailer storage facility. Alarm system 100 detects alarm conditions, transmits a signal, and activates remote devices or automatic vehicle locations systems. Further, pagers, sirens, strobe lights and other devices may be used to alert the driver or persons in the immediate area that an alarm has been triggered.

Figure 2:
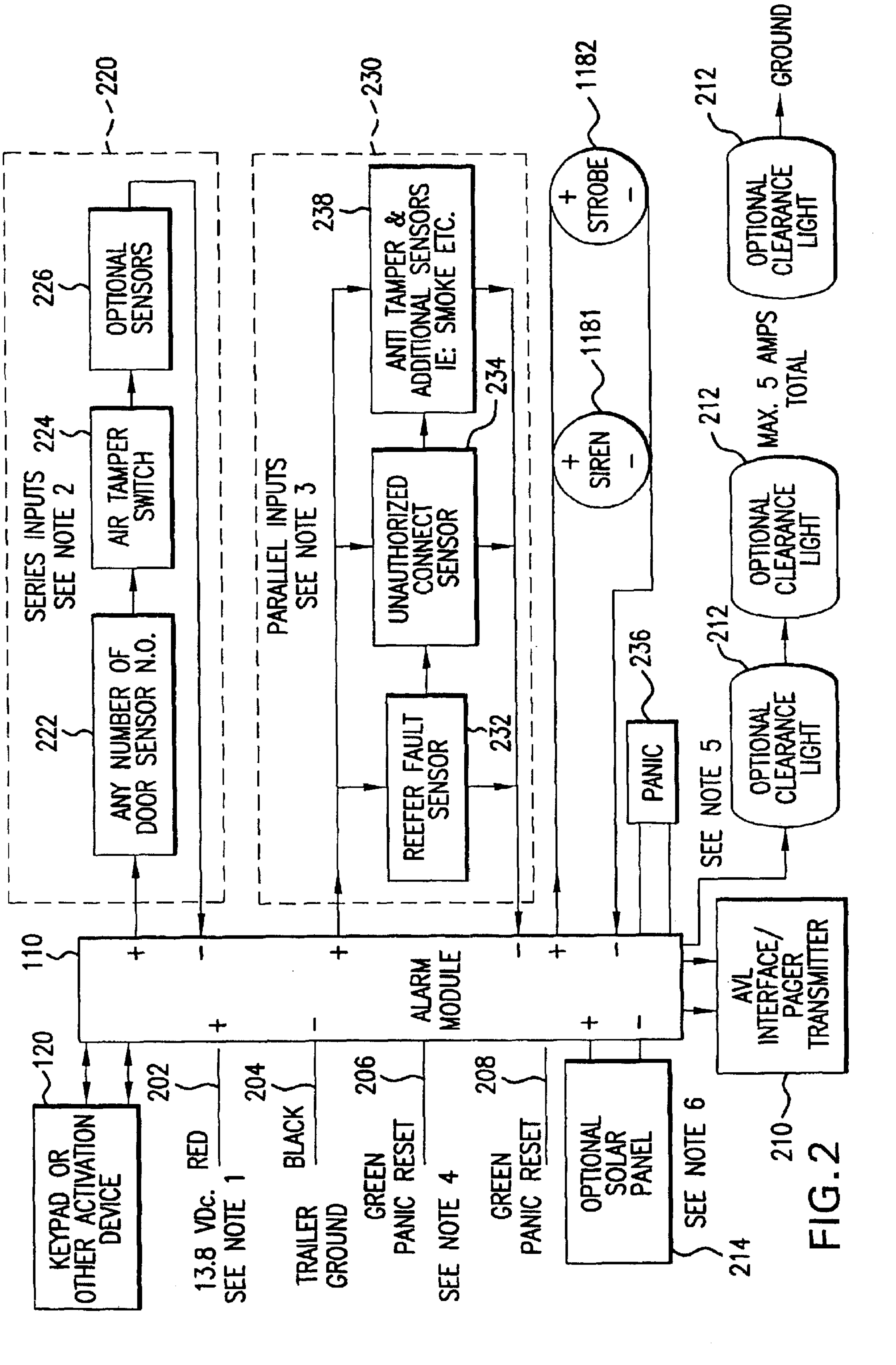
FIG. 2 shows the components of the alarm system.

FIG. 2 depicts alarm module 110 and associated peripherals in accordance with one embodiment of the present invention. As depicted in FIG. 1, alarm module 110 is coupled to keypad 120. Alternatively, keypad 120 may be any activation device that interacts with alarm module 110 to input commands or codes. Keypad 120 includes a code that allows interaction with alarm module 110. Preferably, this code is changed by replacing the keypad 120. Alternatively, this code may be changed by using a keypad 120 that is user programmable. Further, keypad 120 and alarm module 110 may be coupled by a cable. This cable allows keypad 120 to be located away from alarm module 110 and housing 128. Thus, alarm module 110 and housing 128 may be placed in a not easily accessible location and keypad 120 may be located elsewhere to be easily accessible. Preferably, any cable between keypad 120 and alarm module 110 is a shielded cable with a maximum length of about 30 meters. Keypad 120 also includes a LED indicator that flashes when alarm module 110 is active. Alternatively, keypad 120 also may include a series of LED's to relay battery condition and tampering information to the driver. Codes and commands inputted via keypad 120 activates or deactivates' sensor input to alarm module 110. The panic input function, as described below, is always active and may not be deactivated by keypad 120.

Input 202 inputs DC voltage to the alarm module 110. Input 202 may be connected to the trailer lights, reefer battery, or any sources operating voltage and charge current to alarm module 110. Preferably, battery 112 supplies 12 volts DC to alarm module 110. Battery 112 receives charge current through the battery charge circuit contained within alarm module 110. The charger system charges battery 112 by receiving power from the trailer light system. Alternatively, in a stand alone storage trailer application, battery 112 receives charge current from solar panel 214. Solar panel 214 is analogous to solar panel 148 depicted in FIG. 1. Further, battery 112 is a 12 volt DC sealed lead acid battery rated at 7 amp. Hours. Input 202 may be connected to a reefer if alarm system 100 is used in a reefer application. Input 204 connects to trailer or vehicle ground. Alarm system 100 can operate from a 12 volt DC negative ground system.

Inputs 206 and 208 are connected to a panic reset output on panic receiver 142 and activate if the panic function of alarm system 100 is activated. Alternatively, inputs 206 and 208 may be connected to an embedded reset switch located in a hidden location within the trailer. During a panic input, no automatic time out exists for the deactivation of alarm module 110. Alarm module 110 continues to activate siren 1181 and strobe light 1182 until the panic reset is used, or the battery 112 is depleted. Panic input 236 activates the panic mode for alarm module 110 and includes an optional wireless transmitter and receiver 142 similar to known car alarms, as indicated in FIG. 1.

When alarm module 110 is triggered by input from sensors 220 and/or sensors 230, alarm module 110 activates transmitter 114, siren 1181, and strobe light 1182. Alarm module 110 activates until it is turned off by entering the correct code via keypad 120 or an automatic time out occurs. A time out is preferable to conform with local noise ordinances. Further, alarm module 110 may activate trailer clearance lights 212. Clearance lights may blink on and off when alarm module 110 is triggered. Siren 1181 produces an audible alarm signal, while strobe light 1182 produces a visual signal. Siren 1181 has a minimum output of more than 96 db. Clearance lights 212 may be incandescent bulbs consuming a maximum current of about 5 amperes. Preferably, alarm module 110 illuminates 20 incandescent lamps mounted in various locations and having a current draw of 250 ma. each.

Series input 220 comprises sensors that provide a normally closed output to alarm module 110. Any number of normally closed sensors 222 may be connected in series with input 222. Sensors 222 may be comprised of, but not restricted to, sensors such as door sensors, smoke sensors, conductive strips to detect penetration of trailer wall, or hazardous material sensors providing a normally closed output. The maximum allowable cable length connecting the series sensors 220 is about 300 meters. Cutting of the cable or a change in the state of sensors 222 will activate alarm module 110.

Parallel inputs 230 are coupled to alarm module 110. Parallel inputs 230 include normally open sensors 232. Sensors 232 are normally open and connected in parallel. Preferably, sensors 232 are connected by a cable having a cable length no greater than about 100 meters. Shorting of any part of the cable, or closing of sensors 232, triggers alarm module 110. Parallel sensors may be a network of sensors, such as, but not restricted to, reefer fault sensors, anti-tamper switches, unauthorized trailer connect, hazardous material sensors, or any sensor providing a normally open output.

Additional sensors may be connected to alarm module 110. Alarm module 110 accepts input of multiple sensors, and specialized sensors for such items as hazardous materials. For example, sensors are placed in a variety of checkpoints on a trailer. A door sensor is placed at the rear door. An additional sensor may be placed at the other rear door or side doors, if applicable. Other sensors may be placed on access hatches or equipment storage boxes anywhere on the trailer. When these doors are opened, a signal is sent to alarm module 110. Sensors also detecting fire, smoke carbon monoxide, and propane can be placed inside a trailer. Pressure sensors can detect sudden changes of pressure within a compartment and alert the driver, dispatcher, or central monitoring station. Other sensors include temperature sensors that trigger alarm module 110 if the temperature should go above or below preset limits. For example, a refrigeration trailer seeks to keep the temperature inside the trailer below a certain temperature to prevent spoiling of food, or the humidity above or below a certain point to prevent damage to stored goods. A sensor connects to alarm module 110 that activates the alarm system to alert the driver or attendant when these conditions have been compromised. The reefer fault sensor will detect the failure of a reefer engine, and triggers alarm module 110 to alert the driver or attendant that a problem exists.

Other sensors are placed around the trailer to detect contact that may result in structural damage to the trailer. These sensor would trigger alarm module 110 if another vehicle or heavy equipment smashes into the trailer.

AVL interface/pager transmitter 210 is activated by alarm module 110 in the event the alarm module 110 is triggered activating a pager and/or an automatic vehicle location system to alert the driver, dispatcher, or central monitoring center that the alarm has been activated.

Thus, alarm system 100 has the capability of local reporting over a distance wherein devices such as strobe 1182, siren 1181, or other known automotive alert devices that are capable of alerting persons in the local area that the integrity of alarm 100 has been violated. Alarm system 100 also has the capability of local paging that alerts the driver that alarm system 100 has been compromised. Interface 210 may include a transmitter capable of transmitting a signal to a pager over a short range. Preferably, this range should be about 4 miles in an open environment.

Figure 3:
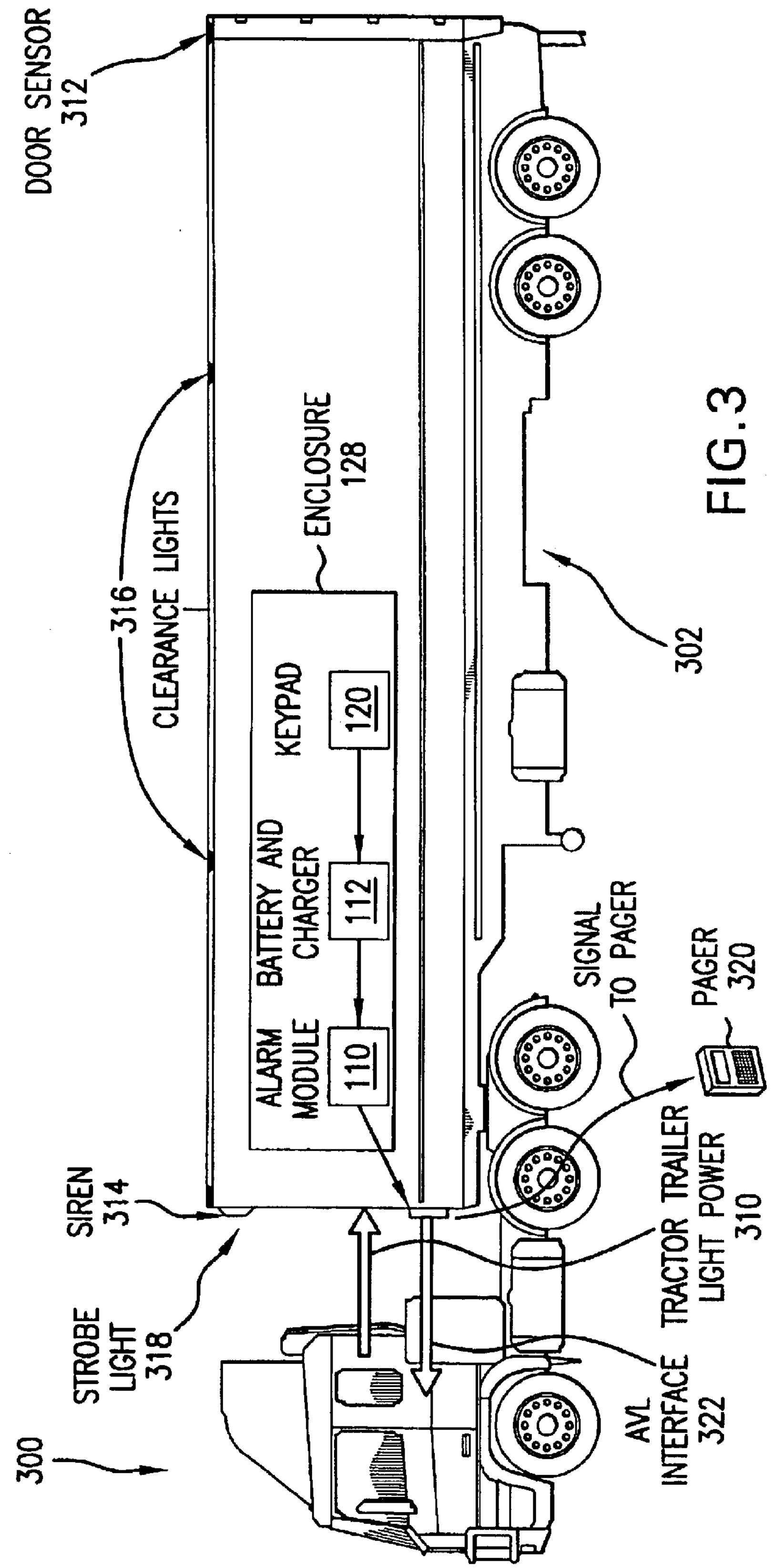
FIG. 3 shows an alarm system installed on a tractor trailer.

FIG. 3 depicts an alarm system in a tractor trailer configuration in accordance with another embodiment of the present invention. Truck 300 is depicted having a trailer 302. As described above, alarm system 100 can be installed on a tractor trailer vehicle where the trailer is detached from the tractor. Thus, the actual monitoring components may be separated physically from the tractor. The tractor however, supplies operating power and battery recharge current through connector 310 if the tractor is connected and operating with the lights on. FIG. 3 depicts various devices on trailer 302. Housing 128 contains alarm module 110. Keypad 120, and battery 112 is located at the front of the trailer, closest to the tractor and easily accessible by the driver.

In addition, housing 128 may contain unauthorized connect sensor 146, reefer fault interface 144, panic receiver 142, anti-tamper switch 119 and transmitter 114 depicted in FIG. 1. Door sensor 312 detects whether the rear door of the trailer is open or closed. As described above, door sensor 312 is connected to alarm module 110. Siren 314 and strobe light 318 are located near the top front of the trailer, while lights 316 encompass trailer 302. If alarm module 110 is triggered, then siren 314, strobe light 318, and lights 316 are activated to alert personnel near trailer 302 that an alarm has occurred. Further, if alarm module 110 is triggered, then transmitter 114 transmits a signal to pager 320 and automatic vehicle location system 322, thus alerting the driver and dispatcher or central monitoring office that an alarm has occurred.

The process for installing and implementing alarm system 100 described above is as follows. An owner of a trailer desires to provide a security system for a tractor trailer configuration. The trailer is sometimes left alone and detached from the tractor. The owner would purchase a kit containing alarm module 110, battery 112, keypad 120 that is contained within housing 128. The kit also contains door sensor 312, strobe light 126, and siren 118. Further, the owner may purchase transmitter 114, panic receiver 142, reefer fault interface 144, unauthorized connect sensor 146 that is enclosed in housing 128. Additional peripherals may be purchased depending on the owners requirements, such as sensors and clearance lights.

According to installation instructions, the owner and/or installer would determine where on the trailer the trailer he or she wishes to install housing 128 and the enclosed contents described above. A hole is drilled through the trailer wall to align with the cable access hole in the rear of housing 128. Housing 128 and contents are mounted on the trailer. The owner and/or installer determines where he or she wishes to place strobe light 1182 and siren 1181, and mounts them accordingly. The required cables are connected to siren 1181 and strobe 1182 and routed inside the trailer, through the cable access hole in the rear of housing 128 and connected to the appropriate output screw terminals of alarm module 110. Sensors 116 are mounted in the appropriate locations and cables routed inside the trailer through the cable access hole in the rear of housing 128 and connected to the appropriate input screw terminals on alarm module 110. If the trailer is a dry van, a power cable is connected between the appropriate screw terminal on alarm module 110 and the trailer light circuit. If the trailer is a reefer equipped trailer, the cable is connected to the reefer battery. If alarm 100 is equipped with transmitter 114, the transmitter antenna is installed. Keypad 120 interconnect cable also is installed. All fuses are installed, and the keypad mounting plate is attached securely. Receiver interface 130 is placed inside the tractor and connected to the tractor battery and the automatic vehicle location system utilized by the owner. The owner also may purchased a pager 149 corresponding to transmitter 114. The driver activates alarm system 100 through keypad 120.

Figure 4:
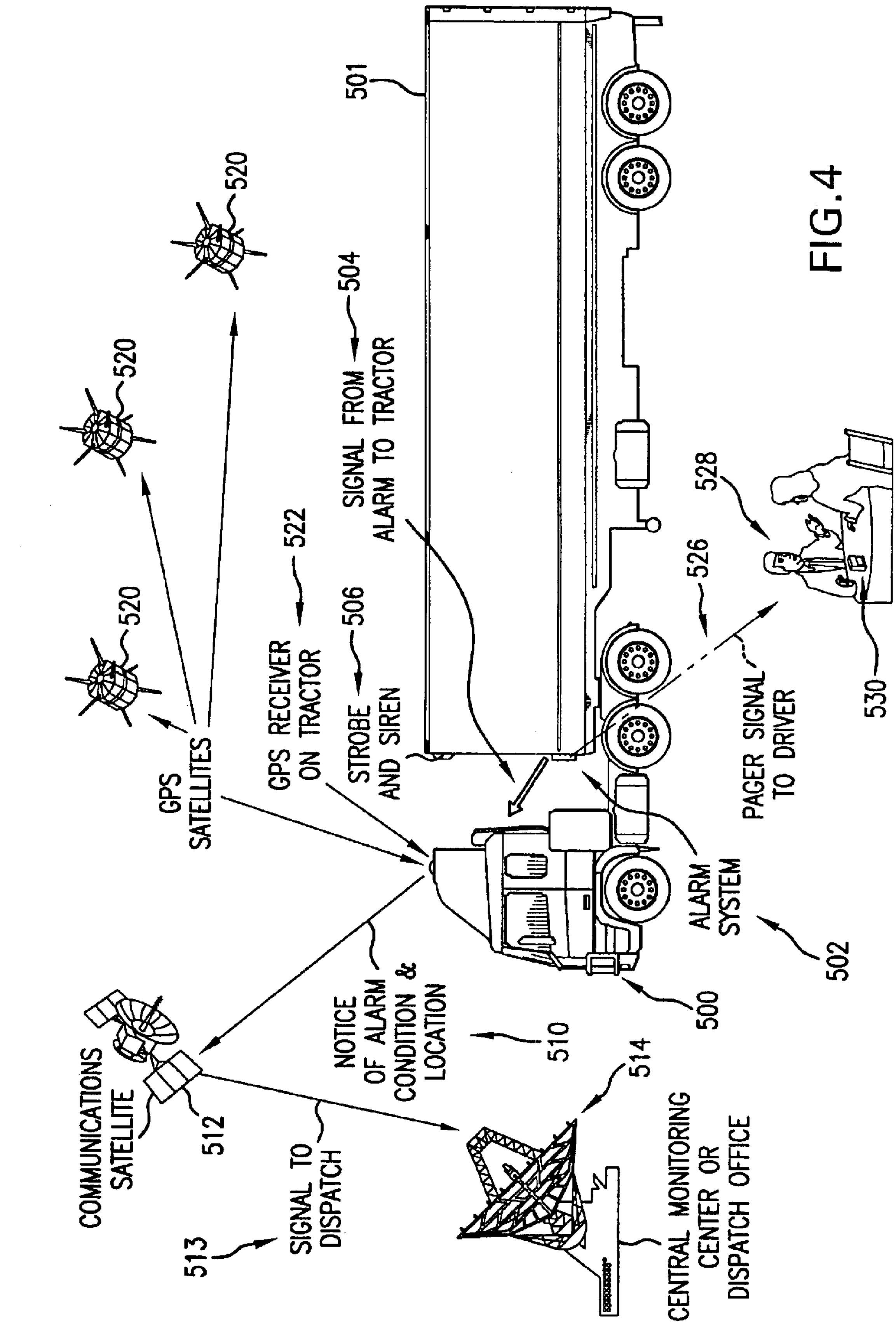
FIG. 4 shows a typical vehicle locator and/or pager reporting device for use with an alarm system.

FIG. 4 depicts a vehicle locator and pager reporting device for use with an alarm system in accordance with another embodiment for the present invention. Truck 500 includes 501, Preferably, trailer 501 is attached to truck 500. Alarm system 502 is mounted on trailer 501. Alarm system 502 is analogous to alarm system 100 described above and mounted according to the mounting instructions described above. When triggered, alarm system 502 sends a signal 504 to a receiving component on truck 500. The receiving component is analogous to receiving component 104 described above. Alarm system 502 also activates a strobe and siren apparatus 506 to alert nearby personnel alarm system 502 has been triggered.

The receiving component on truck 500 transmits a notice signal 510 to a satellite 512. Notice signal 510 indicates that alarm signal system 502 has been triggered and that the proper authorities be notified. Communication satellite 512, transmits dispatch signal 513 to central monitoring center 514. Central monitoring center 514 also may include a dispatch office that sends someone to investigate the condition of truck 500 and trailer 501. Central monitoring center 514 also may alert security personnel or the police, the alarm system 502 has been triggered.

Once alarm system 502 has been triggered, GPS satellites 520 are queried to provide GPS coordinates for the location of truck 500 and trailer 501. These coordinates are transmitted to GPS receiver 522 located on truck 500. GPS receiver 522 may include location information with notice signal 510 to central monitoring center 514. Thus, central monitoring center 514 not only receive information that alarm system 502 has been triggered, but also the location of truck 500 and trailer 501.

In addition to notifying central monitoring center 514, alarm system 502 can notify driver 528 that alarm system 502 has been triggered. Pager signal 526 is transmitted from alarm system 502. Pager 530 receives pager signal 526. Driver 528 receives the message from pager 530 that alarm system 502 has been triggered. Thus, driver 528 may act accordingly. Alternatively, pager signal 526 may be transmitted from the receiving component on truck 500. In this embodiment, pager signal 526 may include the location information provided by GPS satellites 520 via GPS receiver 522.

A need for automated, long-term tracking of events involved in delivery system operations was discussed above. In view of this need, according to embodiments of the present invention, alarm system 100 comprises means for automated, long-term tracking and reporting of events as described in the following.

As described earlier, sensors 116 (or 200/222) and 122 (or 230/232) are distributed among various checkpoints of a tractor-trailer configuration so as to monitor various selected events as they occur. Alternatively, sensors 116 (or 200/222) and 122 (or 230/232) could be distributed at checkpoints of a body job such as a van. Sensors 116 (or 200/222) and 122 (or 230/232) are connected to alarm module 110. According to embodiments of the invention, the occurrence of events detected by sensors 116 (or 200/222) and 122 (or 230/232) is recorded by alarm module 110. Events recorded by alarm module 110 could also include inputs from keypad 120 or the wireless fob. The recorded events may be events that cause alarm module 110 to activate at least one of an audible and a visible alert, and/or transmit a signal to receiver/interface 130 as described above. Such an event could be, for example, an attempt to break into the trailer, or a fire in the trailer. For conciseness, in the following, activation of at least one of an audible and a visible alert, and/or transmitting a signal to receiver/interface 130 as described above is referred to simply as an "alert."

Additionally, recorded events may be ordinary events that do not necessarily need to trigger an alert. Such ordinary events may include, for example, the authorized entry or departure of a person to or from the driver's seat of a vehicle, the authorized opening or closing of the driver's side door of a vehicle, the authorized opening of a container, the authorized starting or shutting off of an engine, or any other event that a user chooses to record.

The information represented by the event records may be useful in decision-making by users, and accordingly, the event records may be downloaded and analyzed by users. According to embodiments, the event records could be downloaded to a separate device such as a laptop computer or PDA (personal digital assistant) device such as a Windows® CE palm top device. The downloaded data could then be processed as desired, for example to format and print reports based on the records, or extract only certain kinds of records.

An illustrative example follows. In this example, assume a delivery van owned by a company is equipped with an alarm system with event recording according to the invention. An operator of the delivery van could arrive at a receiving destination, exit the van, de-activate the alarm system, open the van-door for unloading, re-activate the alarm system, and return to the van some period of time later. However, the engine might have been left running during this period of time. Depending upon how long the period of time was, a significant security risk may have been incurred. Similarly, a non-negligible amount of fuel may have been wasted. Assuming the alarm system was configured to record the above-described events, the information could be used by the delivery company to help improve operator efficiency and security protocols, and encourage compliance therewith.

For another illustrative example, assume that a tractor-trailer company has contracted with a receiver that the receiver must unload a trailer delivered to it by a certain time, or pay an agreed-upon fee. Such contracts are typical since trailer space represents a valuable and time-sensitive commodity. For purposes of verifying contract performance, a trailer equipped with event recording according to the invention would enable, for example, the recording of time-critical information such as the time that the trailer doors were opened by the receiver for unloading, and subsequently closed following unloading.

Figure 5:
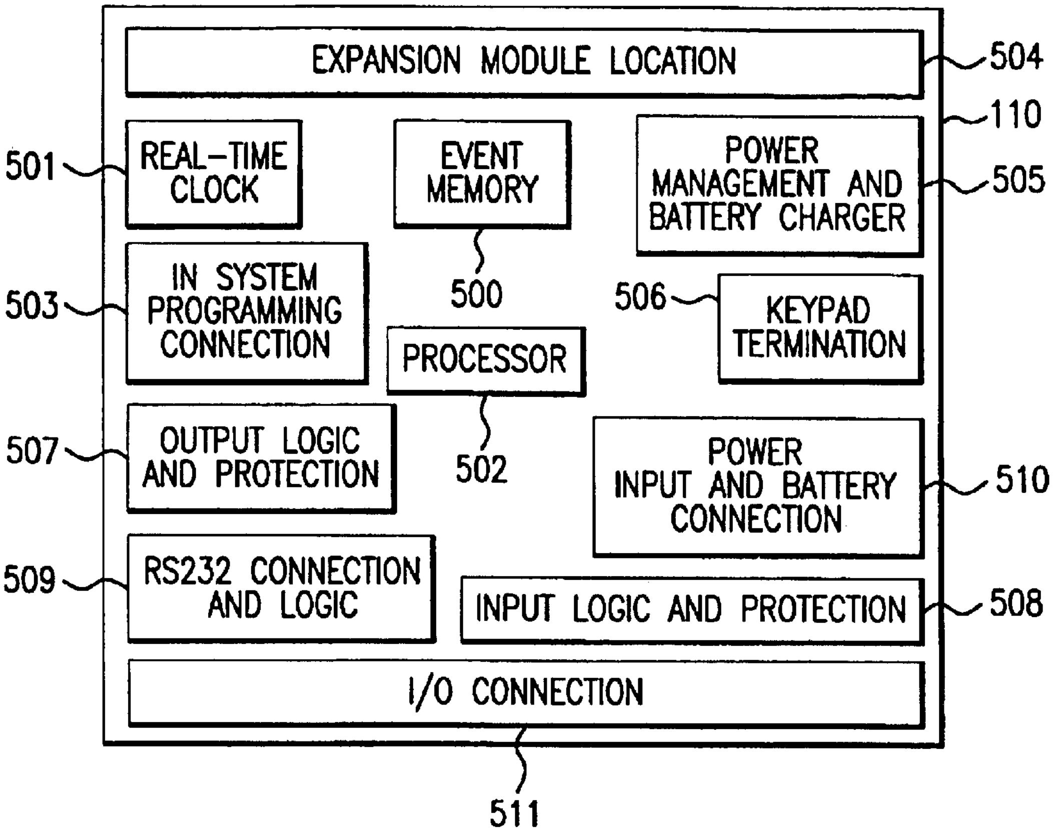
FIG. 5 shows details of an alarm module according to the invention.

In consideration of the foregoing, FIG. 5 shows one possible embodiment of alarm module 110 with event recording. Alarm module 110 may, for example, be implemented in a PCB (printed circuit board). Alarm module 110 includes an event memory 500 for storing records corresponding to selected types of events. Event memory 500 is non-volatile, so that the event records are retained even when power is removed from event memory 500. According to embodiments, event memory 500 may be a 24C64 serial EEPROM.

A real-time clock 501 supplies a unique date and time stamp to each event record stored in event memory 500. Real-time clock 501 is connected to a back-up battery (not shown) and a regulated 5V power supply located in power management and battery charger circuit 505. If the regulated 5V power supply is removed from the real-time clock 501, the back-up battery will power real-time clock 501, enabling it to continue to operate, and preserving any values stored in its memory. According to embodiments, real-time clock 501 may be a DS 1307 chip.

A programmable processor 502 controls the functions of alarm module 110. Processor 502 performs such operations as monitoring sensors 116 (or 200/222) and 122 (or 230/232) for events to be recorded in event memory 500, and writing the events in event memory 500. Processor 502 also initializes real-time clock 501 with a current time or time zone setting selected by a user. Other functions of processor 502 include monitoring keypad inputs, and performing communication control and battery level monitoring.

The communication control aspect of processor 502 operations includes controlling transmitting equipment via RS232 connection and logic block 509, for wirelessly downloading event records from event memory 500 to a separate device. The transmitting equipment may be an external RS232 device such as an RF or infrared device. According to embodiments, communication parameters set by processor 502 may be 19,200 baud, 8-bit data, no parity, 1 stop-bit and no handshaking. The downloading may be initiated by function keys of keypad 120 monitored by processor 502, as further discussed below. According to embodiments, processor 502 may be an Atmel AVR8515, which is an 8-bit processor with RISC (reduced instruction set computer) architecture.

Processor 502 includes a flash memory and an EEPROM (not shown) for storing program code that processor 502 executes in performing its functions. The program code may be changed by a user as desired via an in system programming connection 503, which allows the flash memory and EEPROM to be written to from an external storage device such as a floppy disk. In an AVR8515 processor, the flash memory is 8 KB and the EEPROM is 512B. The AVR8515 processor also includes a 512B SRAM.

As noted above, processor 502 executes user-configurable program code in performing its functions. The program code includes an initialization and monitoring routine, an event handler routine, and a keypad entry handler routine.

In the initialization and monitoring routine, processor 502 performs a process including initializing alarm module 110 in response to a power-on, then entering an idle state. In the idle state, micro-processor 502 waits for signals from sensors 116 (or 200/222) and 122 (or 230/232) indicating that an event has been detected, and waits for signals indicating that a key on keypad 120 has been pressed.

It is noted that, according to embodiments, the fob could be used to remotely activate and de-activate alarm system 100. "Activated" (also referred to herein as "armed") means that alarm system 100 is responsive to sensor signals such that it generates an alert if an unauthorized action is detected; "de-activated" (also, "disarmed") means that alarm system 100 is not activated or armed. Activating or de-activating alarm system 100 using the fob may be treated as an event.

When an event is detected, processor 502 emerges from the idle state and calls the event handler routine. After the event handler routine has executed, processor 502 returns to the idle state.

When a key press is detected, processor 502 emerges from the idle state and calls the keypad entry handler routine. After the keypad entry handler routine has executed, processor 502 returns to the idle state.

In the event handler routine, the processor 502 performs a process including determining whether an input corresponding to the event is valid, and if so, determining whether the input is from the fob. If the input is from the fob, processor 502 may activate or de-activate alarm system 100, and record this as an event.

If the alarm input is not from the fob, the alarm handler routine may determine whether the event is one that should trigger an alert. If so, it may be determined whether alarm system 100 is active. If alarm system 100 is active, an alert is generated, and the event is recorded in event memory 500.

On the other hand, if alarm system 100 is not active, or the event is not one that should trigger an alert, the event is simply recorded in event memory 500.

The event handler routine may then clear the input corresponding to the last event, and determine whether there are any new or additional inputs corresponding to new or additional events, which it will handle as described above. The event handler routine may also determine whether any key presses have occurred, and if so, call the keypad entry handler routine. When all inputs have been handled and cleared, the event handler routine returns to the initialization and monitoring routine.

Alarm module 110 further includes keypad termination logic 506. Keypad termination logic 506 may be configured for a 3×4 matrix keypad, allowing for inputs from 12 keys. Inputs from keypad 120 may be decoded and acted upon by processor 502 according to the keypad entry handler routine noted above. An input from keypad 120 could be, for example, a personal identification number (PIN) identifying an operator authorized to activate or de-activate alarm system 100, or control or configure alarm module 110.

In the keypad entry handler routine, processor 502 executes a process including looping to detect a key press, then determining whether the key press is valid. If so, the keypad entry handler routine determines whether the key pressed is a "function" key. The function keys are keys which, according to one embodiment, are distinct from numerical keys of keypad 120, such as a "pound sign" (#) key. A function key may be pressed to activate downloading of event records to a separate device, as discussed above in connection with the communication control aspect of processor 502 operations. Another function key may be pressed, for example, to check battery status. A function key may also be used to change the PIN, in combination with the numerical keys. If the key pressed is a function key, the keypad entry handler routine branches to a separate function handler routine.

If the key pressed is not a function key, the keypad entry handler routine then determines whether a valid PIN has been entered. If a valid PIN has been entered, the keypad entry handler routine may activate or de-activate alarm system 100, and correspondingly update status LEDs as described below.

Lines connecting keypad termination logic 506 with keypad 120 may be multiplexed with status LEDs mounted on keypad 120. The status LEDs indicate the current status of the alarm system to a keypad operator. For example, in addition to PIN entry status, the LEDs indicate new PIN code entry success and internal battery level.

Alarm module 10 also includes an expansion module location 504 to provide for future hardware add-ons that may be desired or needed.

Power management and battery charger functional block 505 supplies power to the circuits of alarm module 110. The power to the circuits may be at a 5V level. Block 505 also provides a regulated DC voltage to external devices that require it. An example of such an external device is a non-passive sensor such as a smoke detector, which requires a separate power supply, in contrast to a passive sensor such as a door contact. The regulated DC voltage may be at a 12V level and may source up to 500 mA to connected external devices. Block 505 may further supply a charging current, for example 500 mA, into a discharged lead acid battery. The charging current will typically be used to charge battery 112 if, for example, the system has been operating in a stand-alone mode and battery 12 has consequently been discharging. As discussed above, the source of the charging current could be, for example, the tractor alternator or the reefer battery. Block 505 may further provide a float current of 5 mA.

Alarm module 110 further includes output logic and protection block 507 and input logic and protection block 508 for functions including protection of output and input circuits, respectively, against random electrostatic discharge. Output logic and protection block 507 may include two output FETs (field effect transistors) that allow processor 502 to switch two high voltage/current devices. According to embodiments, the FETs may be respectively connected to siren 118 (or 1181) and strobe 126 (or 1182).

I/O connection block 511 provides for inputs from sensors 116 (or 200/222) and 122 (or 230/232), for supplying signals to processor 502 indicating the occurrence of events. Software executed by processor 502 may be configured to recognize each input and, when a signal is received on a particular input, write an event record corresponding to that particular input to event memory 500.

Power input and battery connection block 510 allows alarm module 110 to receive power from battery 112 in a stand-alone mode, or from an external power source such as a reefer battery or tractor alternator.

As described above, embodiments of the present invention automatically track and record selected events, in order to collect data which may be useful in decision-making by users. Events corresponding to an activation of a sensor or inputs from keypad 120 or the fob are automatically recorded in event memory 500, along with the date and time of the event, supplied by real-time clock 501. A serial number of the alarm system may also be recorded in each event record. The event records stored in event memory 500 can subsequently be downloaded and analyzed by users.

As noted above, alarm system 100 may be armed or disarmed at will by an authorized user, such as a tractor-trailer operator provided with a PIN as described above. The user may use keypad 120 or, optionally, the fob to arm or disarm alarm system 100. Alarm system 100 could also be configured to arm automatically, for example when doors are closed or locks are engaged. Whether alarm system 100 is armed or disarmed, those events which alarm module 110 is configured to record will continue to be recorded.

Figure 6:
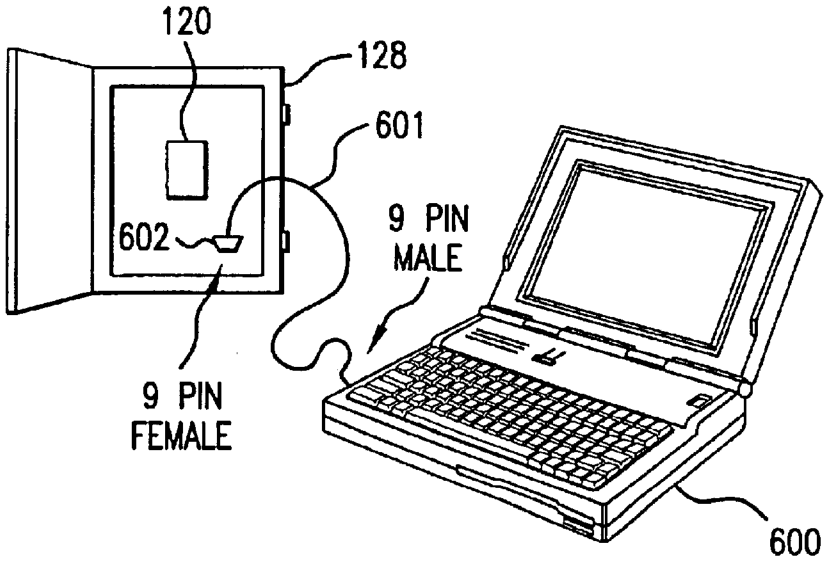
FIG. 6 shows an arrangement for downloading records from the alarm module to a separate device, such as a laptop computer.

As noted earlier, the event records could be downloaded to a separate device such as a laptop computer. FIG. 6 illustrates such a downloading arrangement. An output port 602 of housing 128 including alarm module 110 (not shown) may be connected by cable 601 to a separate device such as laptop computer 600. Upon user-initiated commands as described below, event records could be downloaded from event memory 500 to a memory of laptop computer 600 via port 602 and cable 601.

As discussed above, alternatively to a wired link to download the event records, a wireless link, for example an RF or infrared link, could be established between alarm module 110 and a receiver for downloading the event records to the receiver.

Of course, the separate device to which the event records are downloaded need not be a laptop computer. As noted above, the separate device could be a PDA. Alternatively, the separate device could be a desktop or other type of computer.

Figure 7:
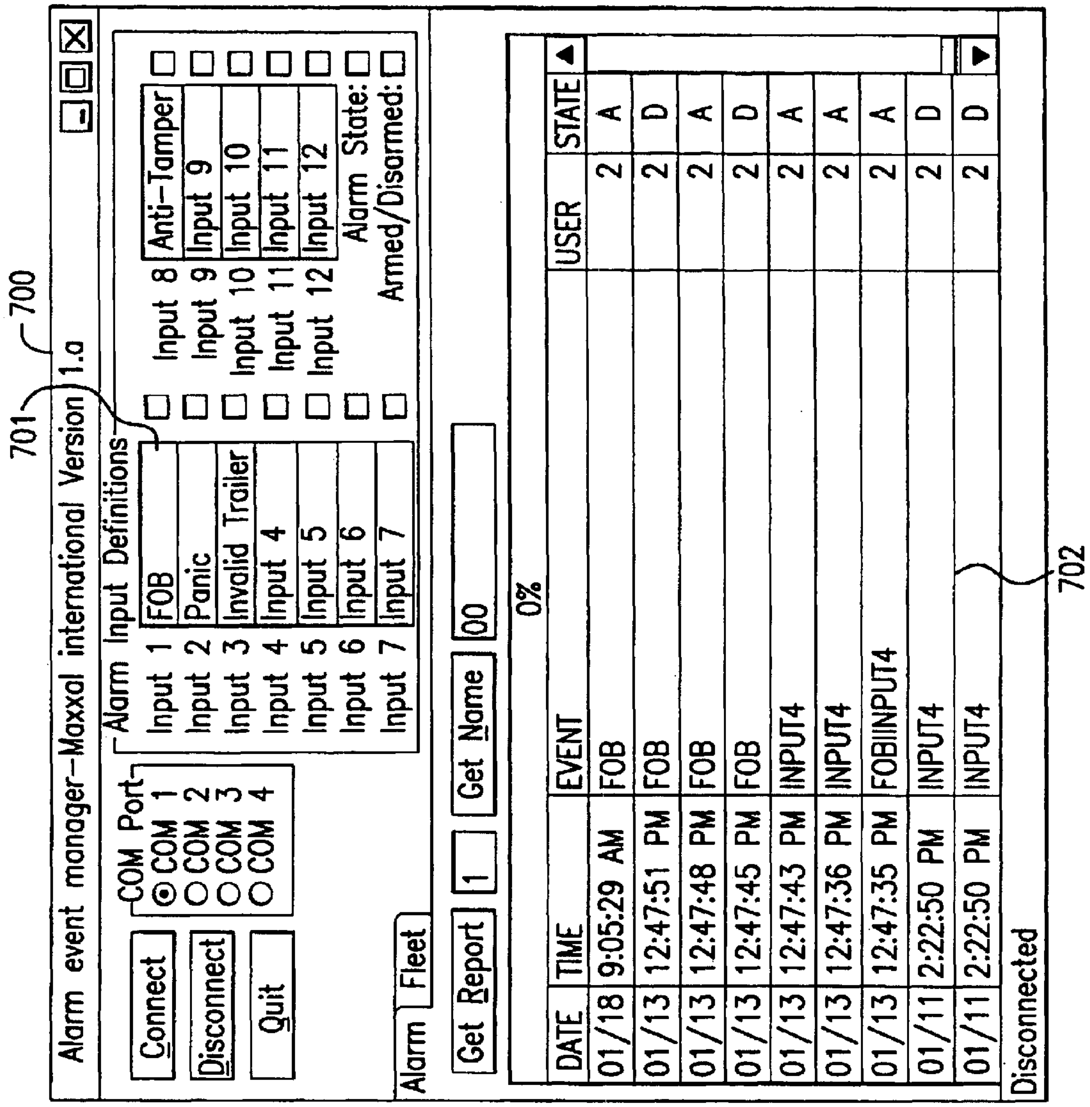
FIG. 7 shows an example of a display of a software user interface according to the invention.

A device which receives the downloaded event records from alarm module 110 may be configured with event record management software according to the invention, for processing the event records. The event record management software could provide a user interface for downloading, displaying and performing various operations on the event records. FIG. 7 shows an example of a display 700 that could be produced by a user interface of the event record management software. Among other fields, an alarm input definitions field 701 is shown. Also shown is an event records sequence 702. Each entry in event records sequence 702 includes a date and time stamp, an event type identifier (e.g., "FOB," indicating that alarm system 100 was armed or disarmed by the wireless fob), a user identifier ("2"), and a state identifier ("A" for "Armed" and "D" for "Disarmed").

The user interface of the event record management software could be configured to allow a user to manipulate a display as shown in FIG. 7 to download event records from alarm module 110. For example, by using an input device such as a mouse, a user might click on a "Get Reports" field of display 700 to initiate a download of the event records from alarm module 110 to laptop computer 600.

In display 700, in "Alarm input definitions" area 701, fields labeled "Input 1" through "Input 12" correspond to sensor or other inputs connected to I/O connection block 511 and monitored by processor 502. The fields may be assigned descriptive identifiers as desired by a user. For example, the fields labeled "Input 1", "Input 2", "Input 3" and "Input 8" are respectively associated with an identifier corresponding to the fob signal ("FOB"), an identifier corresponding to the panic receiver signal 142 ("Panic"), an identifier corresponding to the invalid trailer (i.e., unauthorized connect) signal 146 ("Invalid Trailer"), and an identifier corresponding to the anti-tamper signal 119 ("Anti-Tamper"). By "associated", it should be understood that an event record or records corresponding to a particular sensor input or other input source is being related to or grouped under an identifier suitable for being recognized and manipulated by software according to the invention. For example, the assigned identifiers and corresponding event records could be displayed as shown in events records sequence 702.

Identifiers could be changed as desired by a user. For example, a user could change the identifiers corresponding to the fields labeled "Input 4", "Input 5", etc. to more descriptive names, such as "Left rear door", "Right rear door", and the like.

The sensor or other inputs corresponding to the "Input 1" through "Input 12" fields shown in display 700 may be connected to checkpoints as desired by a user in order to monitor and record selected events. For example, in order to track a sequence of events as described above in one illustrative example, "Input 4" could be associated with a sensor for monitoring the opening and closing of the rear door of the delivery van. "Input 5" could be associated with a sensor for detecting the presence of a person in the driver's seat of the van "Input 6" could be associated with a sensor for detecting the starting and shutting off of the van engine.

Similarly, the other input fields could be associated as desired with events arbitrarily selected by a user to be recorded.

Figure 8:
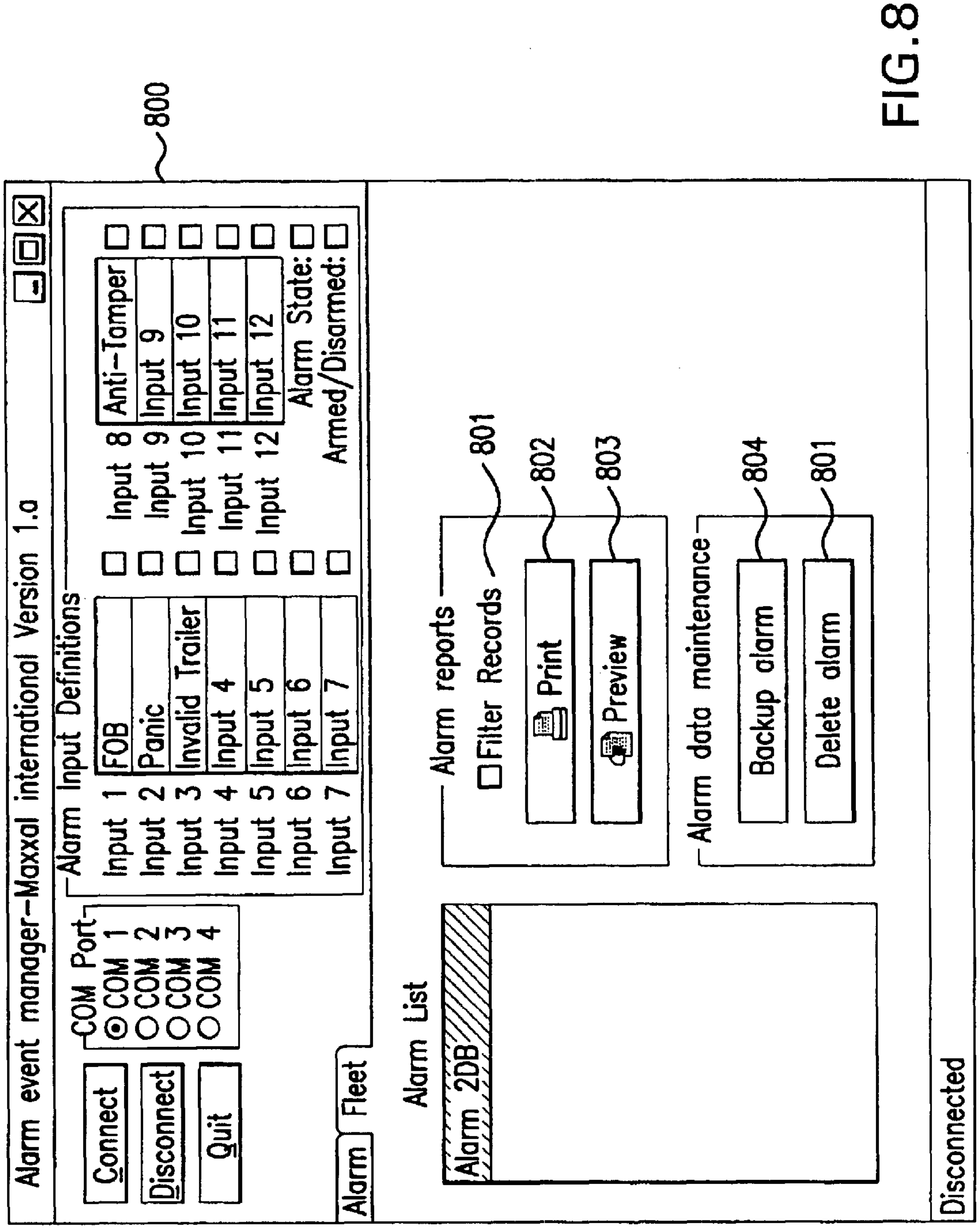
FIG. 8 shows another example of a display of the user interface.

The event record management software could further be configured to enable a user to apply filters to the event records, so that only specific event records that a user wants to see are displayed on the laptop computer's view screen, or printed in a report. FIG. 8 shows an example of another possible display 800 of a user interface of the event management software which provides for user inputs in a filter field 801 for extracting selected ones of the event records. Also shown in display 800 are additional input fields for selected user-initiated functions, including a print field 802 for printing event records, a print preview field 803, a "Backup alarm" field 804 for making a back-up copy of the event records, and a "Delete alarm" field 805 for deleting event records. The event record management software may further provide the capability for exporting the event records, for example for processing by a spreadsheet package.

Since event memory 500 is of finite size, the number of event records that can be retained in the memory is of course finite. However, the capacity of event memory 500 is sufficient that a long-term record of events may be created, so that useful information may be derived therefrom. The capacity of event memory 500 may be, for example, on the order of hundreds of event records. When the capacity of event memory 500 is reached, new event records may be recorded on a first-in, first-out basis.

It should of course be apparent that while the foregoing has described primarily a tractor-trailer application, the invention would be advantageous in a wide range of other applications. Such applications include, for example, any other kind of transportation or delivery application, using vehicles such as personal automobiles, vans, trucks or even boats.

As noted above, elements of the invention may be implemented in computer-executable instructions, such as program code executed by processor 502 and the event record management software. The computer-executable instructions could be tangibly embodied in computer-usable media such as diskettes, magnetic tapes, CD-ROMs, RAM, ROM, FPGAs (Field Programmable Gate Arrays) or ASICs (Application Specific Integrated Circuits).

What has been described is merely illustrative of the application of the principles of the present invention. Other arrangements and methods can be implemented by those skilled in the art without departing from the spirit and scope of the present invention.

What is claimed is:

1. An alarm system for a vehicle, comprising:

an alarm module programmable through an input device in a housing common to the alarm module and the input device;

a plurality of sensors connectable to said alarm module, for detecting events associated with said vehicle; and a vehicle location system for determining a location of said vehicle responsive to a signal from said alarm module;

wherein said alarm module includes an event memory for storing a plurality of event records corresponding to events detected by said plurality of sensors.

2. The alarm system of claim 1, wherein said alarm module is couplable to a separate device for downloading said event records to said separate device.

3. The alarm system of claim 1, wherein said alarm module further comprises a processor for monitoring inputs from said sensors and writing said event records to said event memory.

4. The alarm system of claim 1, further comprising software for processing said event records.

5. The alarm system of claim 1, wherein the vehicle location system is configured to use global positioning system (GPS) data.

6. An alarm system for use with a trailer and a separable tractor therefor, comprising:

a plurality of sensors capable of being distributed at checkpoints of said trailer to detect events occurring at said checkpoints;

an alarm module housed in a weather-resistant housing connectable to said trailer, said alarm module being configured to activate an alert in response to an event detected by said sensors, and including an event memory for recording events detected by said sensors, the alarm module programmable through an input device in the housing;

a siren and a strobe light connectable to said alarm module, for generating, respectively, an audible and a visible alert in response to said alarm module; and a receiving component locatable in said tractor, comprising an interface for receiving a signal generated by said alarm module in response to an event, and a vehicle location system coupled to said interface, for determining a location of said receiving component in response to said signal.

7. The alarm system of claim 6, further comprising a wireless device for remotely activating and de-activating said alarm system.

8. The alarm system of claim 6, further comprising a pager that receives said signal from said alarm module and generates an alert in response thereto.

9. The alarm system of claim 6, wherein first ones of said plurality of sensors are connected to said alarm module in series, and second ones of said plurality of sensors are connected to said alarm module in parallel.

10. The alarm system of claim 6, wherein the vehicle location system is configured to use global positioning system (GPS) data.

11. An alarm system for a vehicle configuration including a container and separable drive means for moving said container, said alarm system comprising:

sensing means for detecting events that occur relative to said container;

memory means for storing a plurality of records of said events;

control means for monitoring said sensing means and recording said events in said memory means, the control means programmable by input means in housing common to the control means and the input means; and receiving means locatable in said drive means, comprising an interface for receiving a signal generated by said control means in response to an event, and a vehicle location system coupled to said interface, for determining a location of said receiving means in response to said signal.

12. The alarm system of claim 11, wherein said control means activates an alert in response to ones of said events.

13. The alarm system of claim 11, further comprising software for processing said plurality of records.

14. The alarm system of claim 13, wherein said software provides a user interface for downloading said event records from said memory means to a separate device.

15. The alarm system of claim 14, wherein said user interface further provides for displaying, printing, and extracting selected ones of said event records.

16. The alarm system of claim 15, wherein said user interface further provides for displaying, printing, and extracting selected ones of said event records.

17. The alarm system of claim 11, wherein the vehicle location system is configured to use global positioning system (GPS) data.

* * * * *